(12) United States Patent
Kryliouk et al.

(10) Patent No.: US 8,921,141 B2
(45) Date of Patent: Dec. 30, 2014

(54) NANOPYRAMID SIZED OPTO-ELECTRONIC STRUCTURE AND METHOD FOR MANUFACTURING OF SAME

(71) Applicant: Glo AB, Lund (SE)

(72) Inventors: Olga Kryliouk, Sunnyvale, CA (US);
Nathan Gardner, Sunnyvale, CA (US);
Giuliano Portilho Vescovi, Lund (SE)

(73) Assignee: Glo AB, Lund (SE)

( * ) Notice: Subject to any disclaimer, the term of this patent is extended or adjusted under 35 U.S.C. 154(b) by 0 days.

(21) Appl. No.: 14/030,145

(22) Filed: Sep. 18, 2013

(65) Prior Publication Data

US 2014/0077220 A1    Mar. 20, 2014

Related U.S. Application Data

(60) Provisional application No. 61/702,658, filed on Sep. 18, 2012.

(51) Int. Cl.
*H01L 33/24* (2010.01)
*H01L 33/20* (2010.01)
*H01L 21/20* (2006.01)
*H01L 33/00* (2010.01)
*H01L 33/58* (2010.01)
*H01L 33/32* (2010.01)

(52) U.S. Cl.
CPC .............. *H01L 33/58* (2013.01); *H01L 33/007* (2013.01); *H01L 33/24* (2013.01); *H01L 33/32* (2013.01); *H01L 33/0075* (2013.01)
USPC  438/39; 257/13; 257/E33.005; 257/E33.006; 438/44; 438/46

(58) Field of Classification Search
CPC ....... H01L 33/007; H01L 33/20; H01L 33/24; H01L 33/32; H01L 21/0254
USPC .............. 257/79, 103, E33.006, E33.023, 13, 257/E33.005; 438/39, 41, 44, 46
See application file for complete search history.

(56) References Cited

U.S. PATENT DOCUMENTS 6,320,209 B1 *  11/2001  Hata et al. ..................... 257/190
6,924,500 B2     8/2005  Okuyama et al.
(Continued)

FOREIGN PATENT DOCUMENTS

KR    10 2012 0067157 A    6/2012
WO    WO 2008/079079 A1    7/2008

OTHER PUBLICATIONS

Wildeson et al., "III-nitride Nanopyramid Light Emitting Diodes Grown by Organometallic Vapor Phase Epitaxy," Journal of Applied Physics, 108, 044303 (2010).

(Continued)

*Primary Examiner* — Yu Chen
*Assistant Examiner* — Jeremy Joy
(74) *Attorney, Agent, or Firm* — The Marbury Law Group PLLC

(57) ABSTRACT

Aspects of the invention provide methods and devices. In one embodiment, the invention relates to the growing of nitride semiconductors, applicable for a multitude of semiconductor devices such as diodes, LEDs and transistors. According to the method of the invention nitride semiconductor nanopyramids are grown utilizing a CVD based selective area growth technique. The nanopyramids are grown directly or as core-shell structures.

29 Claims, 12 Drawing Sheets

(56) References Cited

U.S. PATENT DOCUMENTS

| | | |
|---|---|---|
| 7,829,443 B2 | 11/2010 | Seifert et al. |
| 2003/0168666 A1* | 9/2003 | Okuyama et al. ............... 257/80 |
| 2003/0180977 A1* | 9/2003 | Suzuki et al. ................... 438/22 |
| 2004/0048409 A1* | 3/2004 | Biwa et al. ...................... 438/46 |
| 2004/0129929 A1* | 7/2004 | Okuyama et al. ............... 257/10 |
| 2005/0170538 A1 | 8/2005 | Okuyama et al. |
| 2007/0085087 A1* | 4/2007 | Okuyama et al. ............... 257/79 |
| 2007/0187704 A1* | 8/2007 | Okuyama et al. ............... 257/95 |
| 2009/0159907 A1* | 6/2009 | Wang ............................... 257/94 |
| 2009/0169828 A1* | 7/2009 | Hersee et al. ................. 428/172 |
| 2010/0148149 A1 | 6/2010 | Pedersen et al. |
| 2010/0163840 A1* | 7/2010 | Seifert et al. .................... 257/13 |
| 2011/0079766 A1 | 4/2011 | Wildeson et al. |
| 2011/0095260 A1 | 4/2011 | Kim |
| 2011/0096134 A1 | 4/2011 | Kang et al. |
| 2012/0068153 A1* | 3/2012 | Seong et al. .................... 257/13 |
| 2012/0153252 A1 | 6/2012 | Kim et al. |

OTHER PUBLICATIONS

International Search Report and Written Opinion received in connection with International Application No. PCT/US2013/060301; mailed Jan. 14, 2014.

* cited by examiner

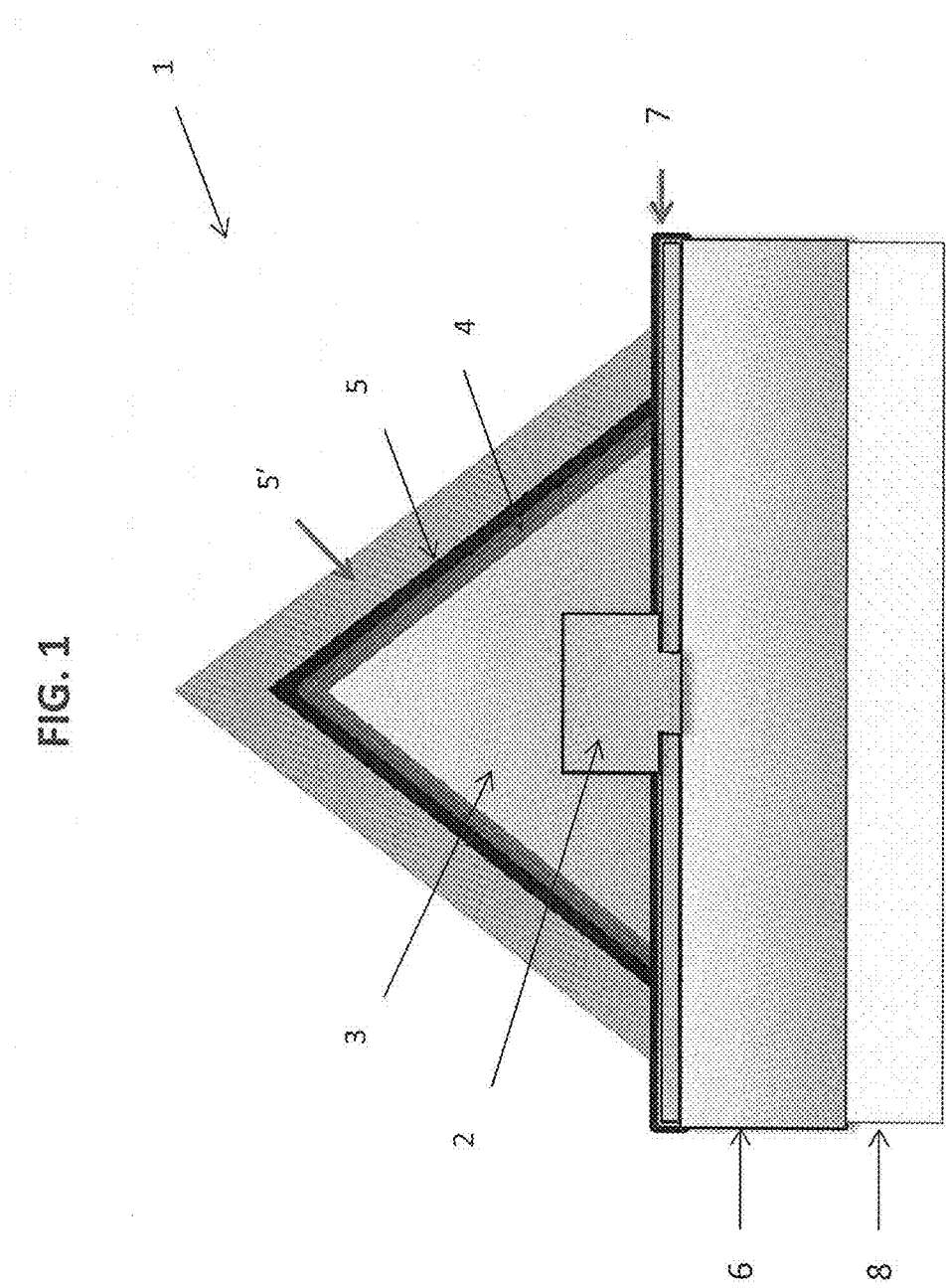

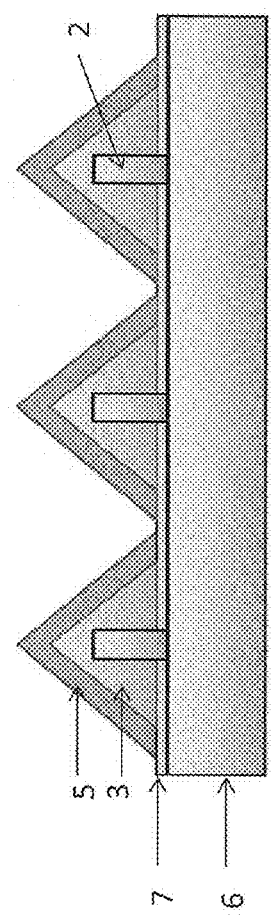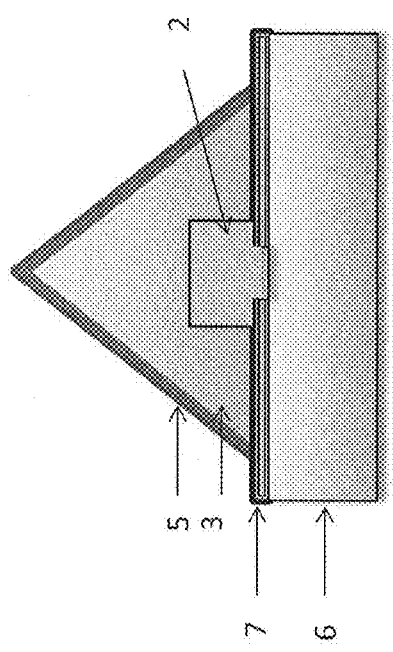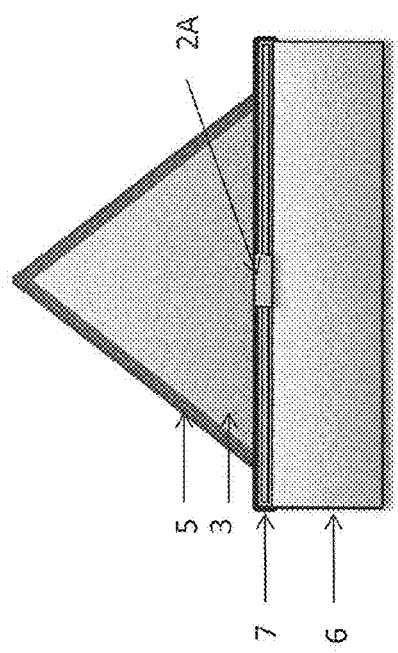

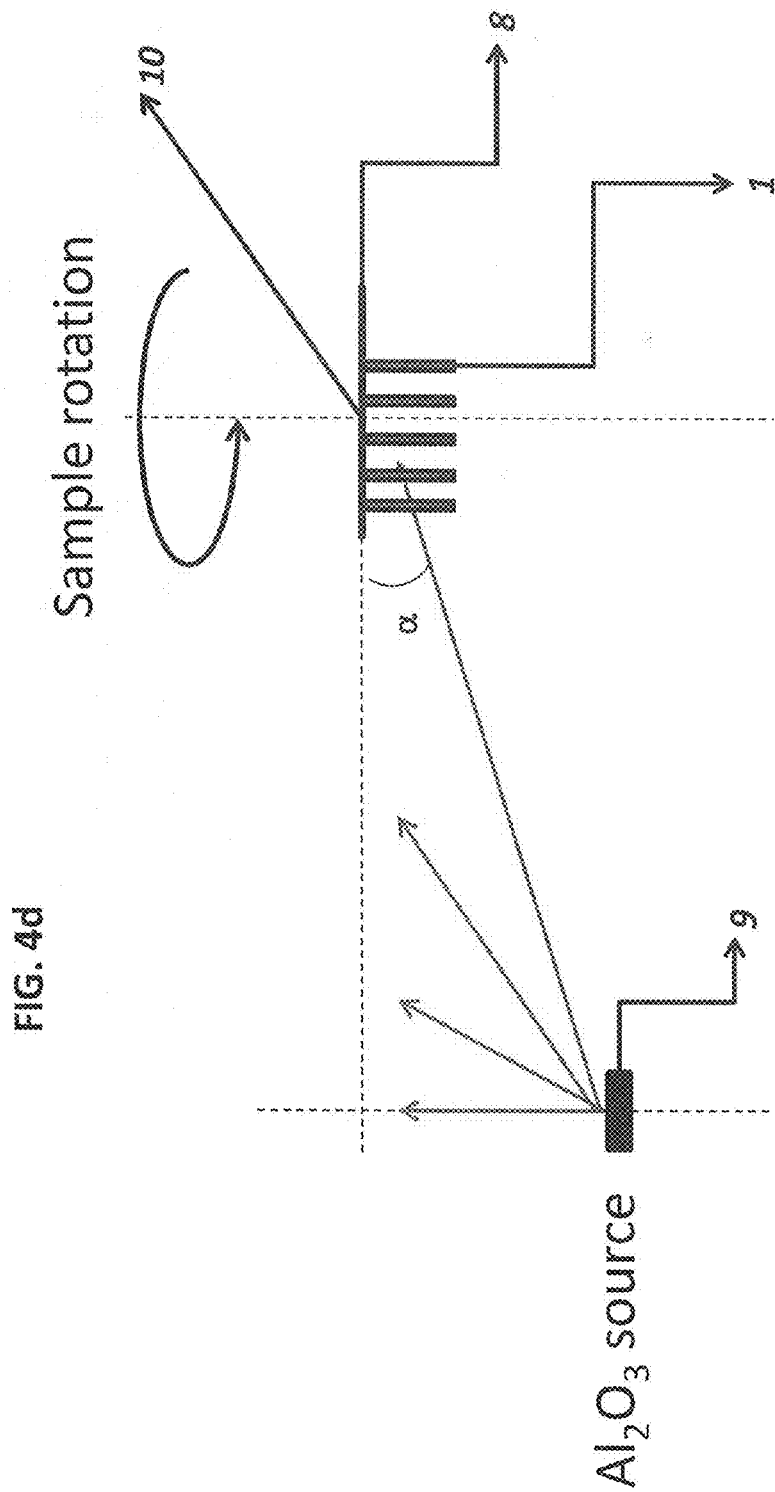

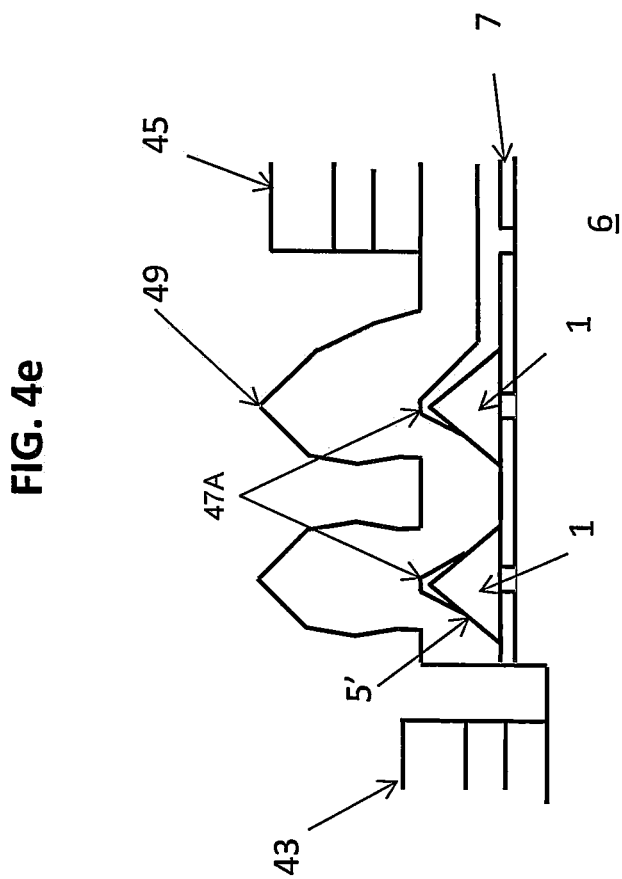

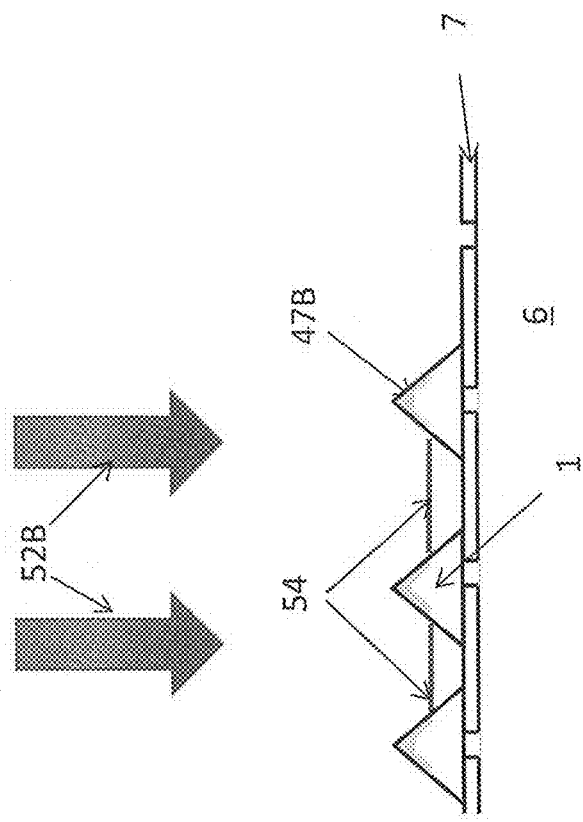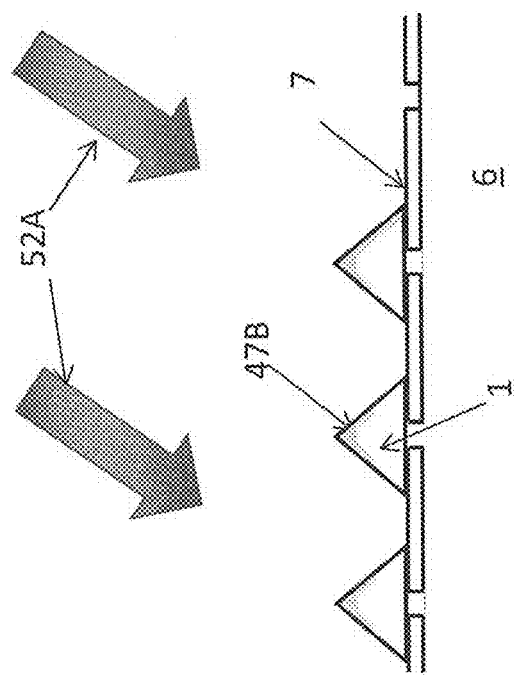

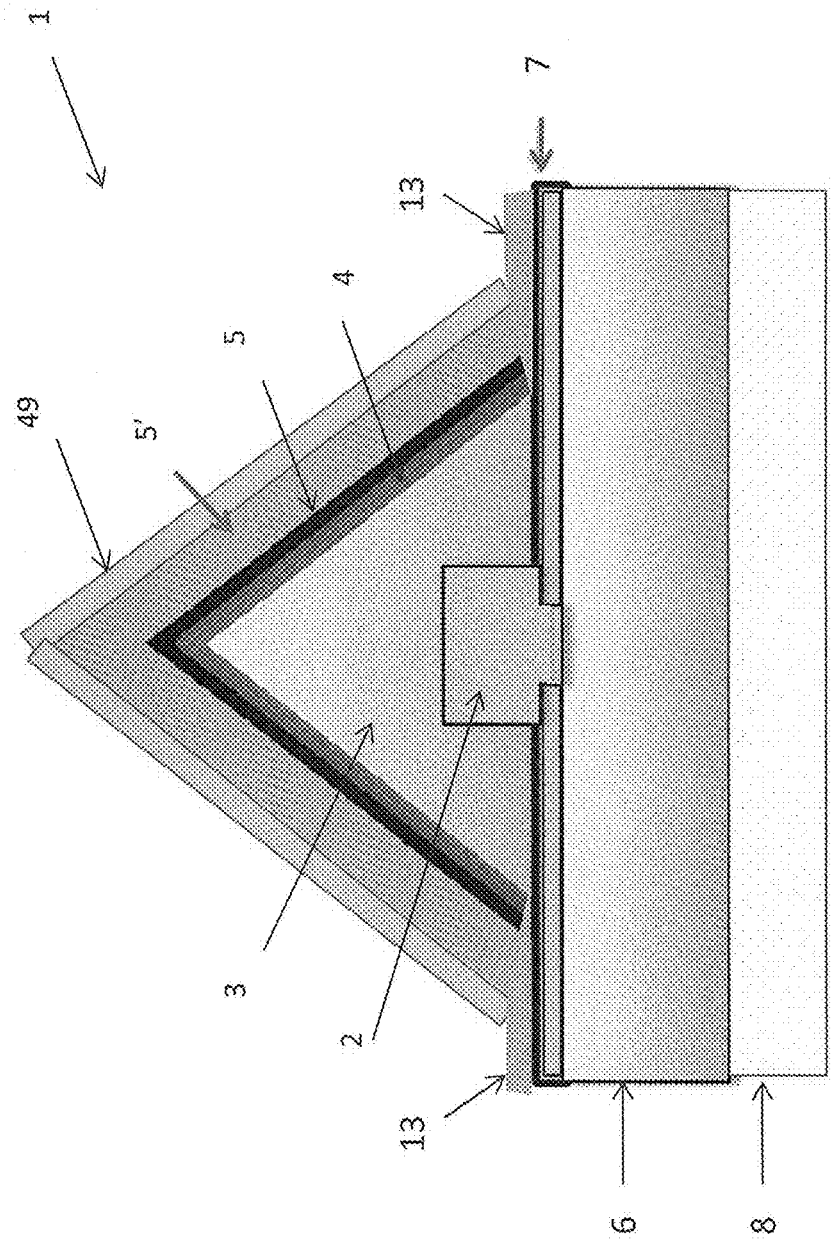

NANOPYRAMID SIZED OPTO-ELECTRONIC STRUCTURE AND METHOD FOR MANUFACTURING OF SAME

FIELD OF THE INVENTION

The present invention relates to semiconductor devices based on semiconductor nanopyramids and the method of producing same.

BACKGROUND

Nanostructures are promising building blocks for electronic and optoelectronic semiconductor devices. The three-dimensional shape of the nanostructures can have challenges in device design. Different crystallographic planes can give different growth rate, material composition, and doping.

SUMMARY

One embodiment provides a method of making a nanopyramid, comprising forming a first conductivity type III-V semiconductor core or core seed using CVD at a first temperature, first pressure and first III-V ratio, forming a first conductivity type III-V semiconductor shell enclosing the core or the core seed of the first conductivity type semiconductor using CVD at a second temperature, second pressure and second III-V ratio, and forming a first layer of a second conductivity type semiconductor over the shell of the first conductivity type semiconductor to form the nanopyramid. At least one of the first temperature, first pressure and first V-III ratio is different from at least one of the second temperature, second pressure and second V-III ratio.

Another embodiment provides a semiconductor light emitting device comprising a support and a plurality of nanopyramids arrayed on the support, each of the plurality of the nanopyramids comprising a first conductivity type semiconductor core or core seed, a first conductivity type semiconductor shell enclosing the core or the core seed of the first conductivity type semiconductor, and a first layer of a second conductivity type semiconductor over the shell of the first conductivity type semiconductor. The first conductivity type semiconductor shell and the first layer of second conductivity type semiconductor are configured to form a pn or pin junction that in operation provides an active region for light generation.

BRIEF DESCRIPTION OF THE DRAWINGS

FIG. 1 schematically illustrates a side cross sectional view of a nanopyramid LED in accordance with an embodiment of the invention.

FIGS. 2a, 2b and 2c schematically illustrate side cross sectional views of nanopyramid LEDs with different shaped cores in accordance with alternative embodiments of the invention.

FIG. 4d schematically illustrates a method of making nanopyramid LEDs using angled deposition to form a tip mask in accordance with another embodiment of the invention.

FIG. 4e schematically illustrates a side cross sectional view of a nanopyramid LED with the tip mask made by the method shown in FIG. 4d in accordance with an embodiment of the invention.

FIGS. 5a and 5b schematically illustrate side cross sectional views of methods of making nanopyramid LEDs with a modified tip in accordance with embodiments of the invention.

FIGS. 8a, 8b, and 8c schematically illustrate side cross sectional views of a nanopyramid LED containing a shell having foot portion in accordance with embodiments of the invention.

DESCRIPTION OF THE EMBODIMENTS OF THE INVENTION

Figure 3A:
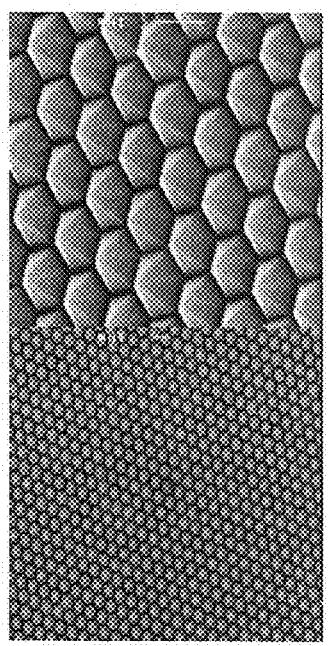
FIGS. 3a-3f are micrographs of nanopyramids in accordance with embodiments of the invention.

The semiconductor device and method to produce such according to the present invention comprises at least one nitride semiconductor nanopyramid, for example a GaN nanopyramid.

One embodiment of the invention is a nitride semiconductor nanopyramid, which in this context is essentially a pyramid shaped structure with a base width or diameter of about 1100 nm and a height range of about 1000 nm. In some embodiments, the base diameter (or width and length for non-circular bases) is about 100 nm to about 1500 nm and the height of the nanopyramids are from about 90 nm to about 1300 nm. In another embodiment, base widths range from 100 nm to several (e.g., 5) µm, such as 100 nm to below 1 micron, and heights range from a few 100 nm to several (e.g., 10) µm. The nanopyramid is at its base epitaxially connected to a support, which comprises of one or more epitaxial layers, for example a layer of GaN closest to the nanopyramid, located over a substrate. The top of the nanopyramid can be a sharp point or a mesa having a width smaller than the base. The nanopyramid core protrudes through an opening in a growth mask of for example SiNx. A semiconductor device according to the invention typically comprises a plurality of nanopyramids. The nanopyramids of the current invention preferably have a hexagonal or cubic base. Preferably, the nanopyramid core is covered by a semiconductor shell, this shell being matched for conductivity with the conductivity of the core and the shell being a pyramid shaped structure. The shell preferably is covered by an active layer with quantum wells and one or more semiconductor layers, such semiconductor layers being of a different conductivity than the core.

In one embodiment of the invention, an array of semiconductor nanopyramids are used to form LED devices. Nanopyramid LEDs are typically based on one or more pn- or p-i-n-junctions. The difference between a pn junction and a p-i-n-junction is that the latter has a wider active region. The wider active region allows for a higher probability of recombination in the i-region. Each nanopyramid comprises a first conductivity type (e.g., n-type) nanopyramid core, a first conductivity type (e.g., n-type) shell, and an enclosing second conductivity type (e.g., p-type) layer for forming a pn or pin junction that in operation provides an active region for light generation. While the first conductivity type of the core is described herein as an n-type semiconductor core and the second conductivity type layer is described herein as a p-type semiconductor layer, it should be understood that their conductivity types may be reversed.

FIG. 1 schematically illustrates the basis for a nanopyramid LED structure in accordance with some embodiments of the invention. In principle, one single nanopyramid is enough for forming a nanopyramid LED, but due to the small size, nanopyramids are preferably arranged in arrays comprising hundreds, thousands, tens of thousands, or more, of nanopyramids side by side to form the LED structure. For illustrative purposes the individual nanopyramid LED devices will be described herein as being made up from nanopyramids 1 having an n-type core 2, an n-type shell 3, and at least one p-type layer 5, such as multiple p-type layers 5 and 5', at least partly enclosing the nanopyramid shell 3 and an intermediate active layer 4. In some embodiments, the nanopyramid core 2, nanopyramid shell 3, the active layer 4 and the p-type layers 5 and 5' may be made up from a multitude of layers or segments. By controlling growth conditions the final geometry of the n-type core 2 can range from elongated to narrow "pillar structures". In some embodiments, the n-type shell is enclosed with one p-type layer.

In alternative embodiments, only the core 2 may comprise a nanostructure by having a width or diameter below 1 micron, while the shell 3 may have a width or diameter above one micron.

FIGS. 2a-2c depict three embodiments of nanopyramids with different shapes of the core 2. FIG. 2a is a nanopyramid with a conventional (e.g., semiconductor nanowire) core, FIG. 2b is a nanopyramid with a paused core (i.e., core formed by paused deposition) and FIG. 2c is a nanopyramid with no core, i.e., the pyramids are gown directly on the growth mask 7 layer and on a core seed 2A located in an opening in the growth mask 7 which exposes the substrate (e.g., buffer layer 6 on supporting substrate 8). For clarity, the thin active layer 4 is not shown and the p-type layers 5, 5' are shown as a single layer 5 in FIGS. 2a-2c.

For nanopyramid fabrication, such as III-V nanopyramid fabrication, the III-V semiconductors are of particular interest due to their properties facilitating high speed and low power electronics. The nanopyramids can comprise any semiconductor material, and suitable materials for the nanopyramid include but are not limited to: GaAs (p), InAs, Ge, ZnO, InN, GaInN, GaN, AlGaInN, BN, InP, InAsP, GaInP, InGaP:Si, InGaP:Zn, GaInAs, AlInP, GaAlInP, GaAlInAsP, GaInSb, InSb, Si. Possible donor dopants for e.g. GaP are Si, Sn, Te, Se, S, etc, and acceptor dopants for the same material are Zn, Fe, Mg, Be, Cd, etc. It should be noted that the nanopyramid technology makes it possible to use nitrides such as GaN, InN and AlN, which facilitates fabrication of LEDs emitting light in wavelength regions not easily accessible by conventional technique. Other combinations of particular commercial interest include, but are not limited to GaAs, GaInP, GaAlInP, GaP systems. Typical doping levels range from $10^{18}$ to $10^{20}$. A person skilled in the art is though familiar with these and other materials and realizes that other materials and material combinations are possible.

Preferred materials for nanopyramid LEDs are III-V semiconductors such as a III-nitride semiconductor (e.g., GaN, AlInGaN, AlGaN and InGaN, etc.) or other semiconductors (e.g., InP, GaAs).

In a preferred embodiment, the nanopyramid is grown on a n-GaN buffer layer 6, with a n-GaN core 2, a n-type GaN/InGaN shell 3, an active layer 4 of InGaN with quantum wells, a layer of p-AlGaN 5, and a layer of p-GaN 5'. The shell 3 may comprise one or more subshells, such as a GaN subshell in physical contact with the core 2 and an InGaN subshell on the GaN subshell. Alternatively, the n-type core 2 and/or the n-type shell 3 may comprise AlGaN or InAlGaN, in addition to or instead of n-GaN and/or n-InGaN. The p-type semiconductor layer(s) (i.e., outer shells) 5 and/or 5' may also include p-AlInN or p-InAlN, in addition to or instead of p-AlGaN and/or p-GaN. Preferably, the active layer 4 of InGaN with quantum wells is about 3-20 nm in thickness. The layer of p-GaN 5' may be coalesced, with or without voids in the coalesced p-GaN layer, such as described in U.S. application Ser. No. 13/245,405, which is incorporated herein in its entirety.

In order to function as a LED, the n-side and p-side of each nanopyramid 1 has to be contacted.

As mentioned above, the first electrode may comprise an n-electrode layer, e.g., a buffer layer 6, such as a buffer layer comprising gallium nitride or aluminum gallium nitride, from which the nanopyramid core was grown during production of the array of nanopyramids. The second electrode may comprise a p-electrode layer that is electrically connected to the p-type layers, such as a transparent conductive oxide layer, e.g., Indium Tin Oxide (ITO). The second electrode may be formed by any suitable method.

The fabrication methods described in U.S. Pat. No. 7,829,443, to Seifert et al., incorporated herein by reference, would be suitable for growth of the nanopyramids described herein, however it should be noted that the invention is not so limited. In one embodiment, the invention is a nanopyramid core to grow semiconductor shell layers on the cores to form a core-shell nanopyramid. For example, in alternative embodiments, only the core may constitute the nanostructure (e.g., nanopyramid) while the shell may optionally have dimensions which are larger than typical nanopyramid shells. Furthermore, the device can be shaped to include many facets, and the area ratio between different types of facets may be controlled.

The use of sequential (e.g., shell) layers may result in the final individual device (e.g., a pn or pin device) having a pyramid shape (i.e., narrower at the top or tip and wider at the base) with cubic or hexagonal or other polygonal cross section perpendicular to the long axis of the device. Thus, the individual devices with the completed shells may have various sizes. For example, the sizes may vary, with base widths ranging from 100 nm to several (e.g., 5) μm, such as 100 nm to below 1 micron, and heights ranging from a few 100 nm to several (e.g., 10) μm.

FIG. 1 illustrates an exemplary structure that provides a support for the nanopyramids. By growing the nanopyramids 1 on a growth substrate 8, optionally using a growth mask, or dielectric masking layer 7 (e.g., a nitride layer, such as silicon nitride dielectric masking layer) to define the position and determine the bottom interface area of the nanopyramids 1, the substrate 8 functions as a carrier for the nanopyramids 1 that protrude from the substrate 8, at least during processing. The bottom interface area of the nanopyramids comprises the area of the core 2 inside each opening in the dielectric masking layer 7. The substrate 8 may comprise different materials such as III-V or II-VI semiconductors, Si, Ge, $Al_2O_3$, SiC, Quartz, glass, etc., as discussed in Swedish patent application SE 1050700-2 (assigned to GLO AB), which is incorporated by reference herein in its entirety. Other suitable materials for the substrate include, but are not limited to: GaAs, GaP, GaP:Zn, GaAs, InAs, InP, GaN, GaSb, ZnO, InSb, SOI (silicon-on-insulator), CdS, ZnSe, CdTe. In one embodiment, the nanopyramids 1 are grown directly on the growth substrate 8.

In embodiments in which a dielectric masking (growth mask) layer is used, the growth mask 7 may be patterned by photolithography to define openings for the nanopyramid growth, as described for example in U.S. Pat. No. 7,829,443, incorporated herein by reference in its entirety. In one embodiment, the nanopyramids are grouped in an n-pad area, a non-active area, a LED area (i.e., the area which emits light) and a p-pad area. However, embodiments of the invention are not limited to this. For example the p-pad area may be arranged on top of the nanopyramids forming the light emitting part of the nanopyramid LED structure, whereby the p-pad area and the LED area coincide, as described in PCT International Application Publication Number WO 2010/014032 A1 to Konsek, et al., published Feb. 4, 2010 and incorporated herein by reference in its entirety.

Preferably, the substrate 8 is also adapted to function as a current transport layer connecting to the n-side of each nanopyramid 1. This can be accomplished by having a substrate 8 that comprises a buffer layer 6 arranged on the surface of the substrate 8 facing the nanopyramids 1, as shown in FIG. 1, by way of example a III-nitride layer, such as a GaN and/or AlGaN buffer layer 6 on a Si or $Al_2O_3$ substrate 8. The buffer layer 6 is usually matched to the desired nanopyramid material, and thus functions as a growth template in the fabrication process. For an n-type core 2, the buffer layer 6 is preferably also doped n-type. The buffer layer 6 may comprise a single layer (e.g., GaN), several sublayers (e.g., GaN and AlGaN) or a graded layer which is graded from high Al content AlGaN to a lower Al content AlGaN or GaN. The nanopyramids can comprise any semiconductor material, but for nanopyramid LEDs III-V semiconductors such as a III-nitride semiconductor (e.g., GaN, AlInGaN, AlGaN and InGaN, etc.) or other semiconductors (e.g., InP, GaAs) are usually preferred. The growth of nanopyramids can be achieved by utilizing methods described in the U.S. Pat. Nos. 7,396,696, 7,335,908, and 7,829,443, and WO201014032, WO2008048704 and WO 2007102781, all of which are incorporated by reference in their entirety herein.

It should be noted that the nanopyramid 1 may comprise several different materials (e.g., GaN core, InGaN active layer and InGaN shell having a different In to Ga ratio than the active layer). In general the substrate 8 and/or the buffer layer 6 are referred to herein as a support or a support layer for the nanopyramids. In certain embodiments, a conductive layer (e.g., a mirror or transparent contact) may be used as a support instead of or in addition to the substrate 8 and/or the buffer layer 6. Thus, the term "support layer" or "support" may include any one or more of these elements. The buffer layer 6 provides a structure for contacting the n-side of the nanopyramids 1.

The above description is exemplary embodiments of a LED structure; however, it will be appreciated that any suitable nanopyramid LED structure or other suitable nanopyramid structure may also be used in the methods and compositions, with any necessary modifications as will be apparent to one of skill in the art, without departing from the invention.

The method of growing nitride semiconductor nanopyramids according to the embodiments of the invention preferably utilizes a CVD based selective area growth technique. A nitrogen source and a metal-organic source are present during the nanopyramid growth step and at least the nitrogen source flow rate is continuous during the nanopyramid growth step.

In one embodiment, the nanopyramids of the present invention are grown using metal organic chemical vapor deposition (MOCVD) processes. Other CVD and hydride vapor phase epitaxy (HVPE) based processes with modifications are also suitable.

One embodiment of the method comprises the steps of: a) providing a growth mask on a support. The support is for example GaN (e.g., n-GaN buffer layer 6 over supporting substrate 8) and the growth mask 7 is a dielectric such as of $SiN_x$ or $SiO_x$, b) produce openings in the growth mask. The openings are preferably well controlled, both in regards to their diameter and their relative positioning. Several techniques known in the art can be used for the procedure including, but not limited to electron beam lithography (EBL), nanoimprint lithography, optical lithography and reactive ion etching (RIE) or wet chemical etching methods. Preferably the openings are about 100 nm to about 200 nm in diameter and pitched about 0.5 to about 5 µm apart. The openings define the position and the diameter of the nanopyramids to be produced. c) Performing nanopyramid growth by a CVD based process wherein the precursor source flows are continuous. The precursor source flow rates are adjusted to achieve a low supersaturation in the growth zone.

Figure 3B:
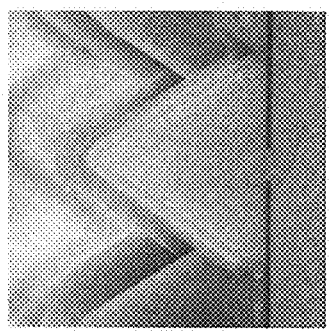
Figure 3C:
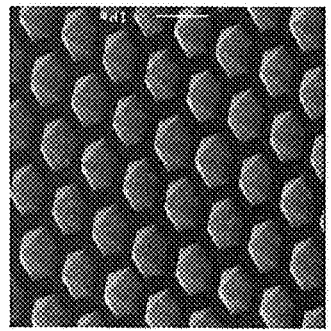
Figure 3D:
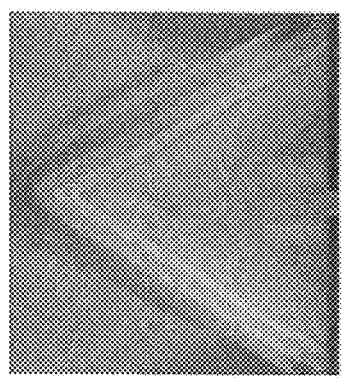
Figure 3E:
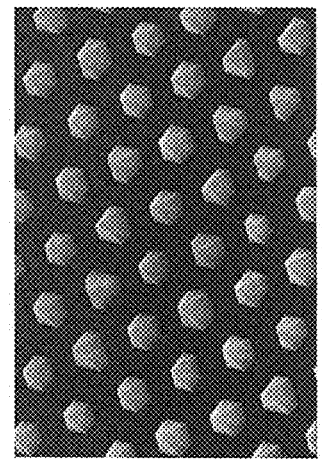
Figure 3F:
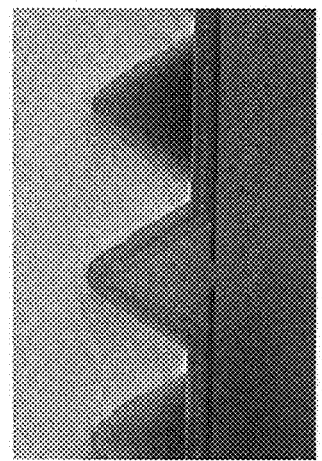

Nanopyramids fabricated with the method according to the invention are illustrated in the SEM images of FIGS. 3a-f. On the starting substrate a layer of $SiN_x$ (about 30-100 nm in thickness) was deposited by PECVD. In a subsequent step, arrays of dot-patterned GaN openings (about 100 nm in diameter) were made by electron beam lithography, EBL, and reactive ion etching, RIE. The pitch between the openings was ranged as about 0.5-3.2 µm, giving a growth mask that defines both the base size and the positions of the nanopyramids. Then, the as-processed samples are inserted into a horizontal MOCVD chamber to grow GaN nanopyramids. FIGS. 3a-f illustrate the different types of nanopyramids formed with the three types of cores. FIGS. 3a and 3b are respective lower and higher magnification micrographs of nanopyramids with a conventional core, FIGS. 3c and 3d are respective lower and higher magnification micrographs of nanopyramids with a paused core, and FIGS. 3e and 3f are respective lower and higher magnification micrographs of nanopyramids with no core, i.e., the pyramids are grown directly on the growth mask layer through the substrate.

In one embodiment, the conventional core is grown at high temperature, low pressure, and extremely low V/III ratio—about 5 to about 10. This growth is continued when both group III and V precursors are supplied during growth. Once a desirable height is reached, growth conditions are switched to lower temperature, higher pressure, and much higher V/III ratio (about 10,000 to about 15,000). Preferred growth conditions are depicted in TABLE 1.

TABLE 1

PREFERRED GROWTH CONDITIONS FOR CONVENTIONAL CORE

| | Temperature | Pressure | V/III ratio |
| --- | --- | --- | --- |
| n-core | About 1000 to about 1200° C. | About 50 to about 100 Torr | About 5 to about 10 |
| n-shell | About 800 to about 1000° C. | About 100 to about 500 Torr | About 10,000 to about 15,000 |

The paused (e.g., interrupted) core is grown in more than one step. The growth conditions are similar to the conditions used to grow a conventional core, however there is a pause during which the metal-organic precursor (e.g., a Group III metal organic precursor, such as TMG, TEG, etc.) is no longer flowing into the CVD growth chamber, but the nitrogen containing precursor (e.g., ammonia) flow is increased (at least an order of magnitude higher). The nucleation and the first step is similar to the growth conditions for the conventional core. Once the core is nucleated and the template's hole is filled, growth is interrupted and the nitridation step is conducted at high ammonia flow. After nitridation, the core growth is resumed using the conditions for growth of a conventional core. In this embodiment of the method for growing the paused core, during growth interruption the ammonia flow is increased significantly and annealing at high ammonia flow is applied. Such plural alternating growth and nitridation (time about 60 to about 180 seconds) steps are performed until desirable height of core is reached. Preferred growth conditions are depicted in TABLE 2.

TABLE 2

PREFERRED GROWTH CONDITIONS FOR CONVENTIONAL CORE

| | Temperature | Pressure | V/III ratio |
|---|---|---|---|
| n-core | About 1000 to about 1200° C. | About 50 to about 100 Torr | Continuous growth with a V/III ratio of about 5 to about 10; followed by nitridation (growth interruption) during which the metal-organic precursor is not flowing and the nitrogen containing precursor (e.g., ammonia) flow is increased to about 15000 to about 20000; after nitridation, metal-organic precursor flow is restarted and the ammonia flow is reduced (5 to 10) such that the growth resumed; These alternating growth and nitridation steps are repeated plural times until desirable height of core is reached. |
| n- shell | About 800 to about 1000° C. | About 100 to about 500 Torr | About 10,000 to about 15,000 |

The direct growth core is achieved under growth conditions of lower temperature, higher pressure, and higher V/III ratio right after core nucleation (e.g., the core nucleus is present in the opening in the growth mask). This is a preferred embodiment of a method for low temperature growth of InGaN pyramids. This enables growth of InGaN pyramids with high In, in a constant trimethyl indium flow providing a uniform In content through the pyramid structure. In another approach, graded In composition is applied when the pyramid is nucleated as GaN and then the In composition is gradually increased from 0 to ~0.6 In/In+Ga. InGaN can also be applied as an underlayer once the GaN pyramid is grown.

In the alternative embodiments illustrated in FIGS. 4 through 7, the nanopyramid structure is modified to decrease the amount of leakage current at the tip of the nanopyramid. In these embodiments, at least one feature (e.g., additional component or structural modification) which reduces or eliminates the leakage current at the tip of the LED device is added to the nanopyramid device.

Figure 4A:
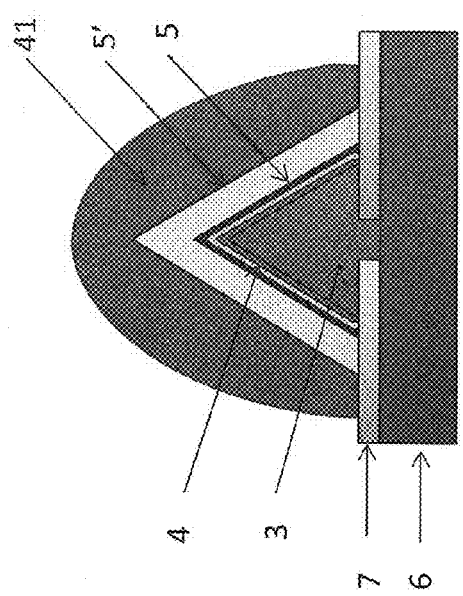
FIGS. 4a, 4b and 4c schematically illustrate side cross sectional views of steps in a method of making nanopyramid LEDs with an etched back tip mask in accordance with an embodiment of the invention.
Figure 4B:
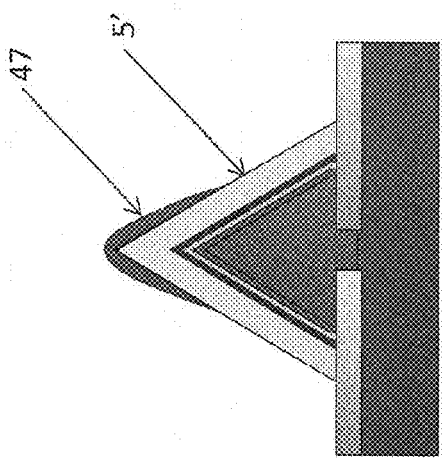
Figure 4C:
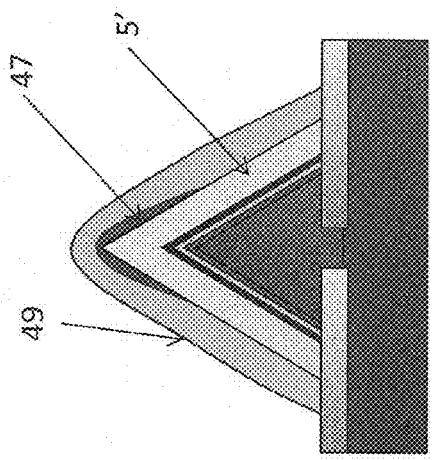

In one exemplary embodiment shown in FIGS. 4a-4c, an insulating tip mask is created to selectively insulate the tip of the nanopyramid 1. An insulating layer 41 is deposited over a nanopyramid structure (e.g., over p-GaN layer 5'). The insulating layer may be $SiO_x$ (silicon oxide, e.g., $SiO_2$) or other suitable insulating material, such as $Al_2O_3$, intrinsic ZnO, $SiN_x$ (e.g., $Si_3N_4$), $HfO_2$, or the like, as known in the art. Other high resistivity materials, such as intrinsic III-nitride semiconductor materials (e.g., i-GaN, i-AlGaN, etc.) may also be used as the layer 41. As shown in FIG. 4a, the insulating layer 41, e.g., $SiO_x$, such as $SiO_2$, is deposited over the nanopyramid structure by any suitable method, such as sputter deposition. Because of the high aspect ratio of the nanopyramids, more insulating material is deposited on the tip (i.e., top) of the nanopyramid than on the lower portion of the sidewalls (e.g., sidewalls of layer 5').

The insulating layer 41 can then be treated by any suitable method, e.g., any suitable etching method, such as anisotropic (non-directional) etch, to selectively remove the insulating layer, and the conditions controlled, e.g., the time of the etch, to allow removal of the insulating layer such that the thinner insulating layer on the sidewalls 5' is removed and the p-GaN layer 5' is re-exposed below the tip, but the tip is still covered with a remaining portion of the thicker insulating layer 47 (i.e., the tip mask), as shown in FIG. 4b. For a given method and nanopyramid structure, the time of etch that produces optimal results may be determined, e.g., either by calculation or by empirical observation, or both, as known in the art. The result is an insulating layer 47 of, e.g., $SiO_x$, such as $SiO_2$, on the top part of the nanopyramid, i.e., on the tip with no insulator or lower insulator thickness on the lower parts of the sidewalls 5'.

A p-side electrode 49, is then formed over the tip mask 47 and the exposed portions of the lower parts of the p-GaN layer 5'. The electrode may comprise any suitable conductive material, e.g., a transparent conductive oxide, such as ITO. The electrode 49 electrically contacts the lower parts of the p-GaN layer 5' but is electrically isolated from the tip of the p-GaN layer 5' by the tip mask 47.

In another embodiment shown in FIGS. 4d and 4e, the tip mask is selectively formed on the tips of the nanopyramids by angled deposition rather than by deposition and etchback described above. The angled deposition method for treating a LED structure that comprises an array of nanopyramids on a planar support comprises providing the insulating tip mask material at a source and causing it to move to the array along a line, where (i) the angle between the line followed by the material and the plane of the support is less than 90° when measured from the center of the support; and (ii) the material is capable of rendering a tip portion of the nanopyramids nonconductive or less conductive compared to before being treated by the material. The LED structure is typically rotated about an axis, or several axes, to expose different portions of the structure to the material produced at the source; in these cases, the center of the support is considered to be the intersection of the axis of rotation with the support.

In certain of these embodiments, the material is an insulator, and renders the tip portion of the nanopyramids nonconductive or less conductive by coating the tip portion. Suitable dielectric materials for use as insulators include $Al_2O_3$, i-ZnO, $SiO_2$, $TiO_2$, $SiN_x$, and $HfO_2$. In certain embodiments, the material is $Al_2O_3$.

In certain of these embodiments, the material reacts with the tip portion of the nanopyramid to render the tip portion nonconductive or less conductive. For example, in certain embodiments the material comprises implanted $H_2^+$, or at least one of noble gas and oxygen plasma.

FIG. 4d illustrates a general scheme for angled deposition of an insulating material on the nanopyramid LED structure. $Al_2O_3$ is shown as the insulator but any suitable insulator, such as dielectric material such as i-ZnO, $SiO_2$, $SiN_x$, $HfO_2$, $TiO_2$, and the like, may be used. The nanopyramid LED structure is held in place so that the support is in a plane as shown, with nanopyramids 1 facing perpendicular to the plane. The nanopyramid LED structure can be considered to have outer nanopyramids and inner nanopyramids, where the outer nanopyramids are the last row of nanopyramids in the nanopyramid LED structure. A source of insulating material 9, e.g., $Al_2O_3$, is positioned such that the source is at an angle α from the plane of the nanopyramid LED structure, where a is measured as the angle between a line from the center of the source of insulating material to the center of the LED structure and the plane of the nanopyramid LED structure. If the shape of the LED structure is irregular, the center is considered to be the point at which the axis of rotation intersects the plane of the LED structure. The axis of rotation may or may not coincide with the center of the substrate 8. There also may be multiple axes of rotation. Energy is supplied to the source of the insulating material so as to cause molecules or portions of the material to enter the vapor phase, e.g., by electron beam evaporation or other suitable technique, e.g., sputter deposition. Molecules or other discrete units of the insulating material move out from the source material and those that intersect the nanopyramid LED structure are deposited on the tips and on the sidewalls of the nanopyramids 1. The nanopyramid LED structure is rotated about its center as the deposition occurs on an axis that intersects the LED structure at a point of intersection 10. Sidewalls of outer nanopyramids may be coated completely, but inner nanopyramids are shadowed from the deposition and the sidewalls of inner nanopyramids are partially coated, the portion of the nanopyramid that is coated being determined by the angle α; generally, the smaller α is, less of the sidewall of inner nanopyramids will be coated. The nanopyramid LED structure may include open spaces or isolated nanopyramids, and in these cases the nanopyramids on the edge of the open space or the isolated nanopyramids may have part or all of their sidewalls coated, depending on the size of the open space or degree of isolation and on the angle α.

An exemplary end result is shown in FIG. 4e. In this case, angled deposition of the insulating layer (e.g., $Al_2O_3$) selectively forms tip masks 47A on the tips of the interior nanopyramids, while leaving the lower parts of the sidewalls of layer 5' exposed.

A transparent conductive oxide (TCO) layer, such as an ITO layer 49, is then deposited over the structure by any suitable method, e.g., sputter deposition, to make electrical contact with the exposed sidewalls of the p-GaN layer 5' of the nanopyramids that have not been coated with the insulating material of the tip mask 47A. This forms a p-side electrode 49.

Then, laser ablation or patterning and etching is performed to expose the n-GaN buffer layer 6 in certain areas. N-side contact conductive layer(s) are formed on the exposed buffer 6 layer to provide an n-side contact 43 which is electrically connected to the n-type portions 2, 3 of the nanopyramids via the buffer layer 6. A p-side contact 45 is then formed on the p-side electrode 49. The insulating tip mask 47A selectively formed by angled deposition on the tip of the nanopyramids acts to prevent or greatly reduce current leakage through the tips of the nanopyramids so that current is directed to the exposed areas of the sidewalls.

In another embodiment, shown in FIGS. 5A and 5B, a $^2H^+$ implant is used to modify the tip parts of the nanopyramids 1 in a nanopyramid LED structure. In this embodiment, the implant modifies the tip of the p-GaN layer 5' to form the higher resistivity tip mask 47B in rather than on the tip of layer 5'.

As shown in FIG. 5A, the tip mask 47B is formed by angled $H_2^+$ implantation schematically shown by arrows 52A. The principle is the same as for the deposition of an insulating material 47A, discussed above, but in the case of hydrogen implantation, $H_2^+$ ions are directed to the substrate. The hydrogen molecules or atoms are implanted to a shallow depth in the tips of the layer 5' of the nanopyramids 1. The depth may be controlled by the energy of the implant and the angle at which the species impacts the surface. The hydrogen passivates active acceptor and or donor dopants in the semiconductor (e.g., p-GaN 5'), thus rendering it less or non-conductive. As with angled deposition of an insulating material, the portion of the sidewalls of interior nanopyramids exposed to the hydrogen implant depends on the angle α; outer nanopyramids sidewalls may be entirely exposed.

In another embodiment shown in FIG. 5C, rather than using an angled implantation, straight line implantation of hydrogen ions schematically shown by arrows 52B may be used instead to form the tip mask 47B. In this embodiment, a sacrificial protective layer 54 may be formed between the nanopyramids 1 to cover the lower parts of the sidewalls but to expose the tips of the nanopyramids. The sacrificial protective layer 54 may comprise a spin-on dielectric layer, such as a spin-on glass or another suitable material, such as photoresist or another polymeric material, which is selectively formed between the nanopyramids 1 but not over the top of the nanopyramids 1. The sacrificial protective layer 54 may be removed by selective etching or another suitable method (e.g., ashing if layer 54 is a photoresist) after the implantation 52B is completed.

In another embodiment, plasma is used to damage the tips. The plasma can be of various suitable species, such as Ar (or another noble gas) or $O_2$. The plasma 52B is directed onto the tips of the nanopyramids 1, while the lower parts of the nanopyramids are covered by a protective layer 54, such as photoresist. Because the nanopyramid tips are damaged from the plasma, electrical current preferentially passes through the lower parts of the side walls.

In one embodiment, $Ar^+$ is used for treatment to increase the resistivity and contact resistance of p-type GaN. By exposing p-type GaN to energetic $Ar^+$ ions, the sheet resistance of the GaN is increased. The contact resistance of ITO 49 to p-GaN 5' is also increased on p-GaN surfaces treated with $Ar^+$ compared to those that are not. The increase in p-GaN sheet resistance and/or contact resistance is sufficient to decrease leakage currents originating in the p-GaN. Substrates containing nanopyramids 1 are placed in a chamber containing argon at a pressure of 100 mTorr, and a plasma is struck with a power of 100 Watts, Ar ions bombard the exposed tips of the nanopyramids 1. In general, the hydrogen implantation and/or the plasma damage forms a higher resistivity III-nitride (e.g., p-GaN) hydrogen implanted or plasma damaged tip region having a higher resistivity than semiconductor sidewalls 5' of the nanopyramids.

Figure 6A:
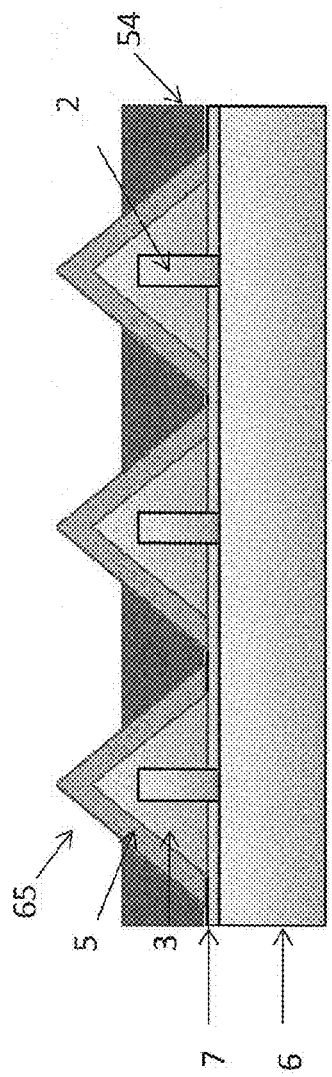
FIGS. 6a, 6b and 6c schematically illustrate side cross sectional views of steps in a method of making nanopyramid LEDs with a removed tip in accordance with an embodiment of the invention.
Figure 6B:
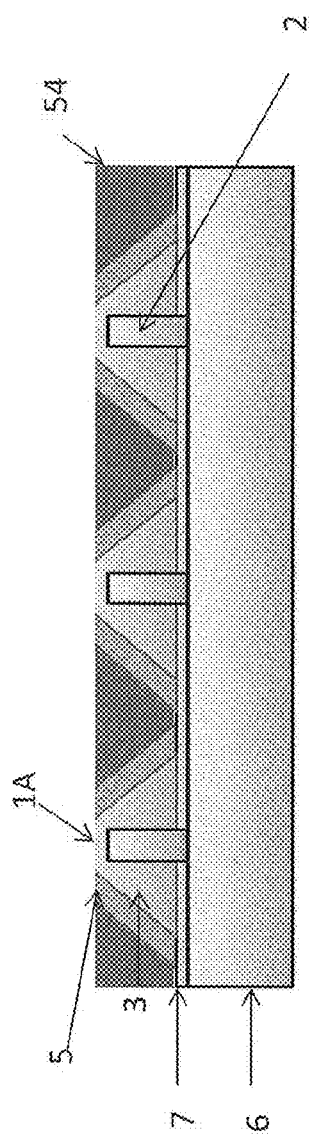
Figure 6C:
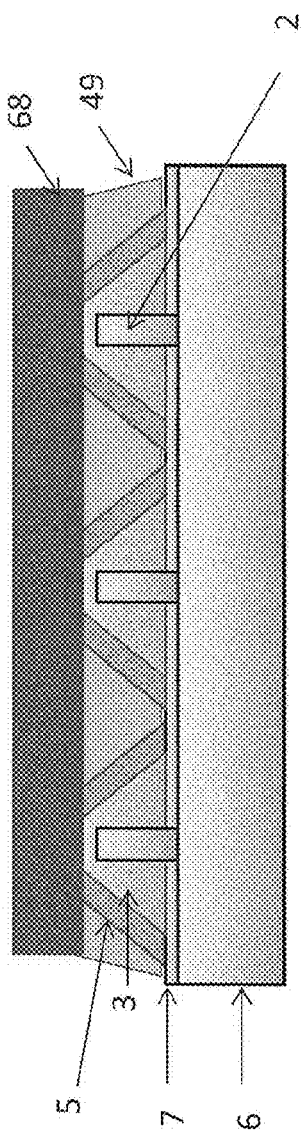

In another embodiment of the invention shown in FIGS. 6a-6c, the tips of the p-GaN layer of the nanopyramids are removed. In a preferred embodiment, the nanopyramid tips are selectively removed leaving the lower parts of layer 5' undisturbed. This technique of removal of the tip can be used in combination with a deposited tip mask 47 (e.g., $Al_2O_3$ film) and/or by increasing the contact resistance and resistivity of the p-GaN by forming the tip mask 47A or 47B in the p-GaN layer 5' tip as described above.

As shown in FIG. 6a, the sacrificial protective layer 54 described above is formed between the nanopyramids such that the tips 65 of the nanopyramids are exposed in the protective layer 54 while the lower parts of the sidewalls 5' are covered by the sacrificial protective layer 54. Then, as shown in FIG. 6b, the exposed tips 65 of the nanopyramids are removed. The tips 65 may be removed by selective etching which etches the tips preferentially to the material of the protective layer 54 or by chemical mechanical polishing such that the top surface of the nanopyramids is even with the top surface of the protective layer 54. This forms a truncated nanopyramid 1A (i.e., a nanopyramid having a trapezoid shape, e.g. a convex quadrilateral with one pair of parallel sides).

Then, as shown in FIG. 6c, the sacrificial protective layer 54 is removed and the p-side electrode 49 is formed in contact with the exposed sidewalls of the p-GaN layer 5' of the nanopyramid 1a. The electrode 49 may be formed by depositing a TCO layer over and between the nanopyramids 1a followed by planarizing the TCO layer by chemical mechanical polishing or etch back to expose the upper surface of the nanopyramids 1a. An insulating layer 68 may then be formed over the electrode 49 and the nanopyramids 1a.

In an alternative embodiment, the p-side electrode 49 may be formed instead of the sacrificial protective layer 54 in FIG. 6a and be used to protect the lower sidewalls 5' of the nanopyramids during the tip 65 removal in FIG. 6b. The electrode 49 then remains in the device as shown in FIG. 6c.

In an alternative embodiment shown in FIG. 7, rather than removing the tip 65 of the completed nanopyramid (e.g., the tip of the p-type layer(s) 5 and/or 5'), the tip 75 of the n-type shell 3 of the nanopyramid 1 is removed before the formation of the active region 4 and the p-type region(s) 5 and/or 5'. As shown in FIG. 7a, the pyramid shaped n-type shell 3 is formed as described above with respect to FIG. 2a, 2b or 2c. Then, the tip 75 of the shell 3 is removed by etching or chemical mechanical polishing. If the desired, the sacrificial protective layer 54 described above with respect to FIGS. 6a and 6b may be used during the tip 75 removal. This forms a truncated pyramid (i.e., a pyramid having a trapezoid shape) shaped n-type shell 3a with a flat upper surface, as shown in FIG. 7b.

Figure 7A:
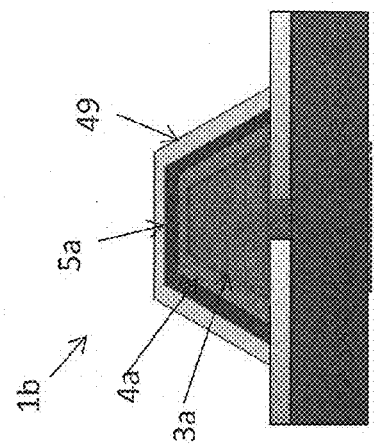
FIGS. 7a, 7b and 7c schematically illustrate side cross sectional views of steps in an alternative method of making nanopyramid LEDs with a removed tip in accordance with an embodiment of the invention.
Figure 7B:
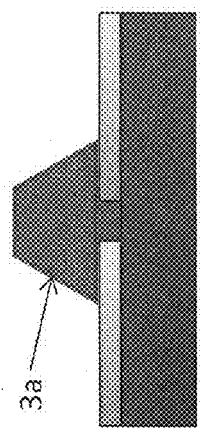
Figure 7C:
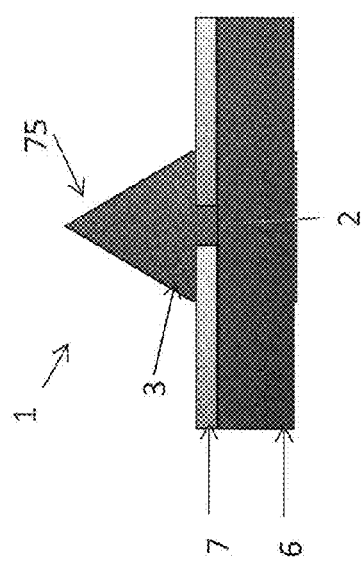

Then, as shown in FIG. 7c, the active region 4a and one or more p-type shells 5a described above are conformally formed on the n-type shell 3a. A p-side electrode 49 is then formed over the device. This forms a truncated nanopyramid 1b shaped LED device.

Figure 7D:
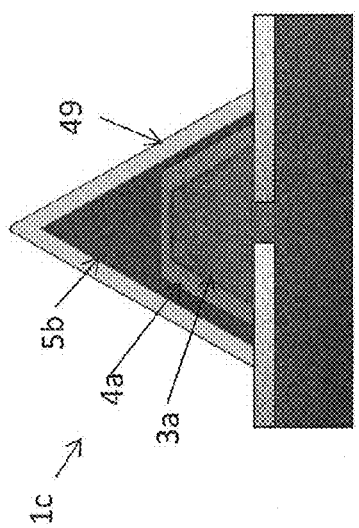
FIG. 7d illustrates an alternative nanopyramid LED to the one shown in FIG. 7c.

In an alternative embodiment shown in FIG. 7d, the active region 4a is formed conformally over the truncated pyramid shaped n-type shell 3a. Then, one or more p-type shells 5b are formed over the active layer. In this embodiment, the p-type shell(s) 5b are not conformally deposited and have a pyramid shape with a relatively sharp tip. The p-side electrode 49 is then formed over the device. This forms a nanopyramid LED device 1c having a pyramid shape, but which includes an internal n-type shell 3a and preferably an active region 4a which have a truncated pyramid shape. The active region thus has c-plane top surface.

In another embodiment, at least one feature (e.g., additional component or structural modification) which reduces or eliminates the leakage current at the base of the LED device is added to the nanopyramid device.

Figure 8A:
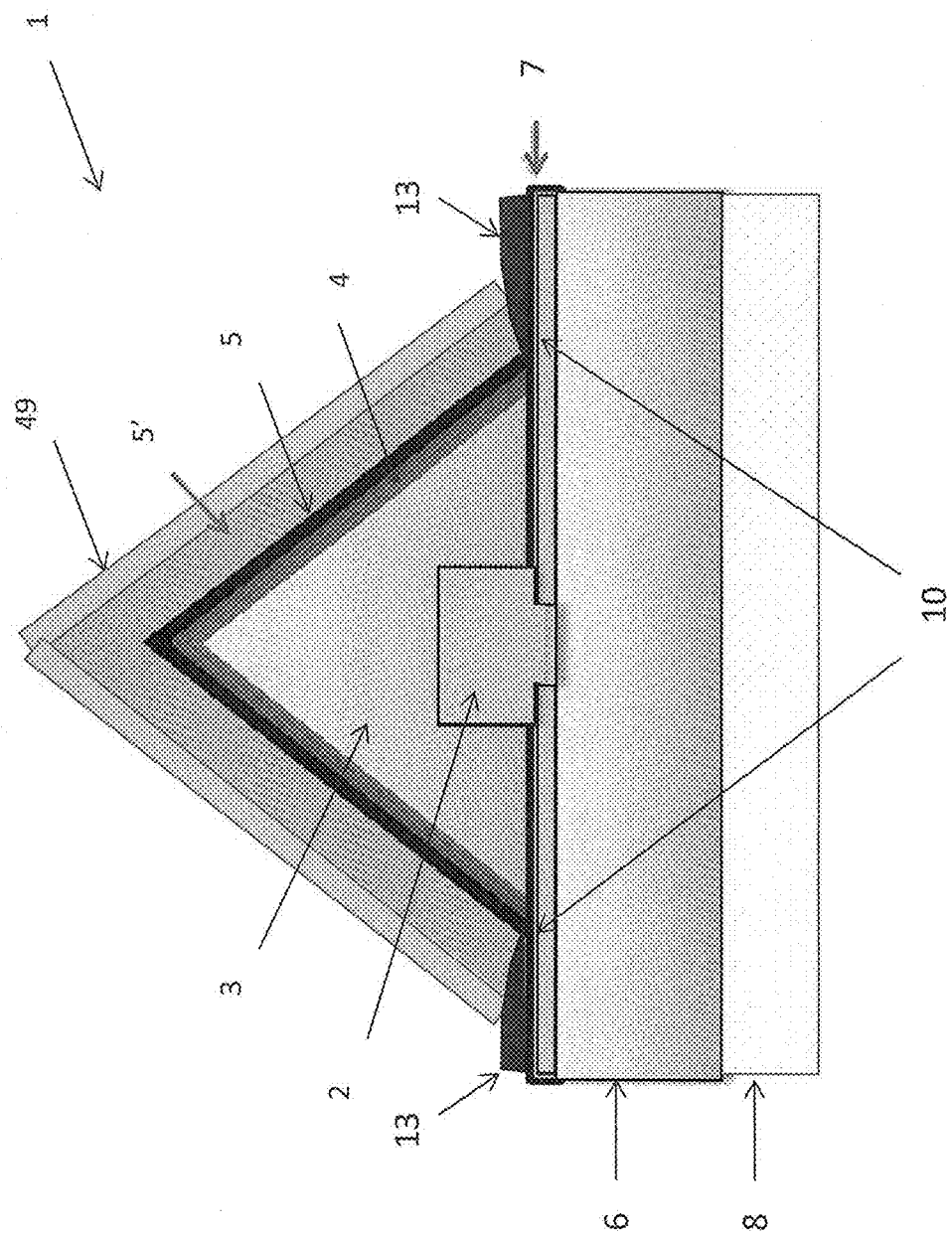

LED radiation (e.g., visible light, UV or IR) emission can be reduced by unintentional leakage of current in the diode. One source of leakage has been identified by its physical location at the "foot" or base region 80 of the nanopyramid LED, as shown in FIG. 8a. The foot or base region 80 is located over the mask 7 between the p-type layer(s) or shell(s) 5, 5' and the n-type interior shell 3/nanopyramid core 2. This base leakage manifests itself by relatively high current, which is below the "turn on" of the diode.

One embodiment of the invention provides a structure and method to reduce this leakage current by decreasing contamination of the masking layer 7 during III-nitride semiconductor layer growth.

Without wishing to be bound by a particular theory, it is believed that decomposition of the silicon nitride masking layer 7 can occur during the growth of high temperature (e.g., at a temperature of at least 850 C) of binary, ternary or quaternary III-nitride semiconductor layers, such as (Al)(In) GaN layers (i.e., AlGaN, InGaN and/or InAlGaN active and/or shell layers). The masking layer 7 is continuously exposed during the growth of (Al)(In)GaN layers because (Al)(In) GaN easily desorbs from the silicon nitride masking layer 7 surface at the high temperature. Contamination of the silicon nitride masking layer from the III-nitride semiconductor growth can potentially create or worsen a leakage current for the device.

In one embodiment, the base leakage may be reduced by the formation of a semiconductor foot 13 portion of the AlGaN p-type layer or shell 5 that extends away from the shell over the surface of the mask 7 exposed between the nanopyramids 1, as shown in FIG. 8a. The foot 13 protects the masking layer 7 from contamination during the growth of the other III-nitride layers (e.g., 5') and thus may reduce the leakage current.

If the nanopyramid core 2 and inner shell 3 comprise an n-type III-nitride semiconductor, such as n-type GaN, then the shell sublayers 5, 5' may comprise p-type III-nitride semiconductor sublayers with a different composition. For example, the inner shell 5 may comprise p-AlGaN and the outer shell 5' may comprise p-GaN.

In an embodiment, a polycrystalline p-AlGaN foot 13 portion of the shell or layer 5 may be formed over the exposed portion of the silicon nitride mask 7 between the inner shells 3 and outer shell 5' during the growth of the shell 5. The foot 13 portion may be formed, for example, by selecting a growth temperature (for example a growth temperature lower than 850 C) and/or CVD precursor gas flow ratio (for example a ratio of the Al containing gas to the ammonia gas, and/or or a ratio of nitrogen to ammonia) that results in the formation of the polycrystalline p-AlGaN foot 13 portion. Other growth conditions or parameters may also be used.

The resistivity of the AlGaN layer increases with increasing Al concentration. Thus, the AlGaN foot 13 portion containing at least 5 atomic percent aluminum has a relatively high resistivity to reduce leakage current. The foot 13 portion also provides a chemically resistant layer to protect the masking layer 7 during device processing and may also behave as a getter for oxygen impurities due to the strong atomic bond of oxygen with Al.

Specifically, AlGaN foot 13 portion may be deposited directly on the silicon nitride masking layer 7. The combination of the shell which contains a foot 13 portion can also be referred to as a foot blocking layer.

The AlGaN layer can be deposited anytime during the device growth. For example, the AlGaN layer may comprise the inner p-type shell 5 which forms the foot 13 portion during growth on the masking layer 7, as shown in FIG. 8a.

In another embodiment, the foot 13 portion is formed prior to the active region 4 formation. In this embodiment, the AlGaN foot 13 portion may comprise a portion of one of the inner n-type shells located under the active region 4. For example, the n-type shell 3 may comprise an outer n-AlGaN subshell having a foot 13 portion and an inner n-GaN or InGaN subshell, as shown in FIG. 8b. In one embodiment, the n-AlGaN shell 3 may contain greater than 5 atomic % Al, such as at least 10 atomic % Al.

Figure 8C:
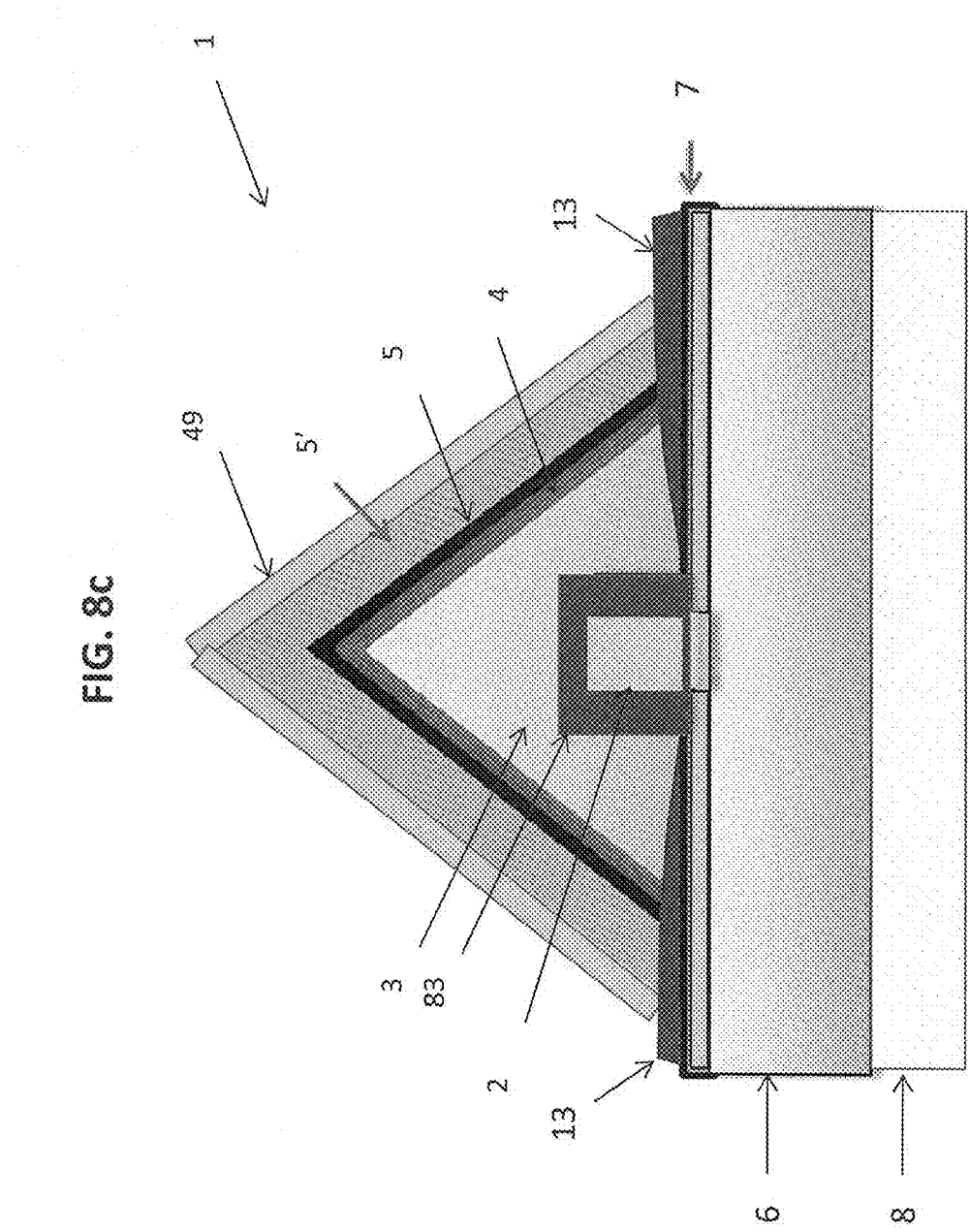

In another embodiment shown in FIG. 8c, an optional n-AlGaN shell 83 (e.g., Si-doped n-AlGaN) having more than 5 atomic percent Al is formed around the nanopyramid core 2. The AlGaN shell 83 growth step also forms an n-AlGaN foot 13 portion on the masking layer 7. The n-type shell 3, active region 4 (e.g., GaN/InGaN quantum wells), and the outer shells (which may comprise p-AlGaN shell 5 and p-GaN shell 5') are then formed on the foot 13 region.

In another embodiment, two foot portions may disposed on the dielectric masking layer 7. For example, shell 5 and one of the shells 3 or 83 may contain separate foot 13 portions which are overlaid on each other. In summary, the foot 13 portion may be formed prior to forming the active region 4, as shown in FIG. 8b or 8c and/or after forming the active region 4, as shown in FIG. 8a. Alternatively, the LED device may comprise multiple foot blocking layers having the same or opposite conductivity type formed before and/or after forming the active region.

The foot blocking layer preferably comprises one or more of Al, Ga, In, B, Si, Mg, N, such as a III-nitride semiconductor, where Si and/or Mg are added as n-type and p-type dopants. In one embodiment, the foot blocking layer comprises AlGaN and has a polycrystalline structure in the regions 13 formed on the dielectric masking layer 8. Regions (e.g., shells 3, 5, 83) formed on a single crystalline layer, core or shell, may have a single crystalline structure. The foot blocking layer may be deposited by any one of several methods, such as metalorganic chemical vapor deposition (MOCVD), molecular beam epitaxy (MBE), plasma-enhanced chemical vapor deposition (PECVD), plasma-assisted molecular beam epitaxy (PAMBE), or reactive sputtering deposition. Other methods may be used as well. In a preferred embodiment, the foot blocking layer comprises polycrystalline AlGaN foot 13 portion on the dielectric masking layer 7 and a crystalline AlGaN shell 3, 5 or 83 formed by MOCVD.

The thickness of the AlGaN foot 13 portion on the silicon nitride masking layer 7 is preferably greater than 10 nm to enable good surface coverage but less than 100 nm to not interfere with the outer shell 5' growth. For example, the AlGaN foot 13 portion may be 20-80 nm thick and contains at least 10 atomic percent Al, such as 10-15 atomic percent. However, other thicknesses may be used.

While the inner shell(s) 3 are described above as being n-type and the outer shell(s) 5, 5' are described as being p-type, it should be understood that their conductivity type may be reversed such that the inner shell(s) are p-type and the outer shell(s) are n-type. In this case, the buffer layer 6 is preferably p-type. The nanopyramids, such as the Group III-nitride (e.g., GaN, GaAlN, InGaN, InGaAlN, etc., nanopyramids, according to the embodiments of the invention can be used in many different applications. Applications of particular interest include electronic, optical and optoelectronic devices including, but not limited to: diodes, light emitting diodes (LEDs), laser diodes, transistors, photonic crystals and detectors. The nanopyramids can also be used as structural building blocks used to, for example, form coalesce continuous layers of GaN. The LED devices are used above as a non limiting example. As appreciated by the person skilled in the art transistors and other electronic devices can be fabricated in the same manner.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

The foregoing method descriptions are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not necessarily intended to limit the order of the steps; these words may be used to guide the reader through the description of the methods. Further, any reference to claim elements in the singular, for example, using the articles "a," "an" or "the" is not to be construed as limiting the element to the singular.

Further, any step or component of any embodiment described herein can be used in any other embodiment.

The preceding description of the disclosed aspects is provided to enable any person skilled in the art to make or use the present invention. Various modifications to these aspects will be readily apparent to those skilled in the art, and the generic principles defined herein may be applied to other aspects without departing from the scope of the invention. Thus, the present invention is not intended to be limited to the aspects shown herein but is to be accorded the widest scope consistent with the principles and novel features disclosed herein.

The invention claimed is:

1. A semiconductor light emitting device comprising a support and a plurality of nanopyramids arrayed on the support, each of the plurality of the nanopyramids comprising:
   a first conductivity type semiconductor core or core seed;
   a first conductivity type semiconductor shell enclosing the core or the core seed of the first conductivity type semiconductor;
   a first layer of a second conductivity type semiconductor over the shell of the first conductivity type semiconductor, wherein the first conductivity type semiconductor shell and the first layer of second conductivity type semiconductor are configured to form a pn or pin junction that in operation provides an active region for light generation; and
   a second layer of the second conductivity type semiconductor over the first layer of second conductivity type semiconductor;
   wherein the device comprises at least one feature which reduces or eliminates leakage current at bases of the nanopyramids, wherein the at least one feature comprises a semiconductor foot portion of at least one of the first conductivity type semiconductor or the first layer of the second conductivity type semiconductor which extends under an electrode contacting the second layer of the second conductivity type semiconductor.

2. The device of claim 1 wherein the first conductivity type semiconductor core comprises n-GaN.

3. The device of claim 1 wherein the first conductivity type semiconductor shell comprises at least one of n-GaN, n-AlGaN, n-InGaN, and n-InAlGaN.

4. The device of claim 1 wherein the first layer of the second conductivity type semiconductor comprises p-AlGaN or p-InAlN and the second layer of the second conductivity type semiconductor comprises p-GaN.

5. The device of claim 1 wherein the first conductivity type semiconductor core is in electrical contact with a buffer layer of the support.

6. The device of claim 1 wherein the first conductivity type semiconductor shell is insulated from the buffer layer by a mask layer.

7. The device of claim 1 wherein the first conductivity type comprises n-type, and the second conductivity type comprises p-type.

8. The device of claim 1 wherein the nanopyramids are located over a dielectric growth mask containing a plurality of openings.

9. The device of claim 8 wherein the first conductivity type semiconductor core or core seed comprises the core which protrudes from one of the plurality of openings.

10. The device of claim 8 wherein the first conductivity type semiconductor core or core seed comprises the core seed which is located in one of the plurality of openings.

11. The device of claim 8 wherein the active region further comprises at least one quantum well located between the first conductivity type semiconductor shell and the first layer of the second conductivity type semiconductor.

12. The device of claim 1 further comprising at least one feature which reduces or eliminates leakage current at tips of the nanopyramids.

13. The device of claim 12 wherein the at least one feature is selected from at least one of an insulating material tip mask, a hydrogen implanted semiconductor tip region having a higher resistivity than semiconductor sidewalls of the nanopyramids, a plasma damaged semiconductor tip region having a higher resistivity than semiconductor sidewalls of the nanopyramids, a flattened tip in truncated pyramid shaped nanopyramids, and the first conductivity type semiconductor shell having a truncated pyramid shape.

14. The device of claim 1 wherein the semiconductor foot portion comprises an AlGaN foot portion having greater than 5% aluminum and which is located on a dielectric growth mask containing a plurality of openings.

15. A method of making a nanopyramid, comprising:
forming a first conductivity type III-V semiconductor core or core seed using CVD at a first temperature, first pressure and first III-V ratio, wherein the first conductivity type III-V semiconductor core comprises n-GaN;
forming a first conductivity type III-V semiconductor shell enclosing the core or the core seed of the first conductivity type semiconductor using CVD at a second temperature, second pressure and second III-V ratio, wherein the first conductivity type III-V semiconductor shell comprises at least one of n-GaN, n-AlGaN, n-InGaN, and n-InAlGaN;
forming a first layer of a second conductivity type semiconductor over the shell of the first conductivity type semiconductor to form the nanopyramid, wherein the first layer of the second conductivity type semiconductor comprises p-AlGaN or p-InAlN; and
forming a second layer of a second conductivity type semiconductor formed over the first layer of the second conductivity type semiconductor, wherein the second layer of the second conductivity type semiconductor comprises-GaN,
wherein at least one of the first temperature, first pressure and first V-III ratio is different from at least one of the second temperature, second pressure and second V-III ratio, and wherein
the first temperature is 1000 to 1200 C and the second temperature is 800 to 1000 C;
the first pressure is 50 to 100 torr and the second pressure is 100 to 500 torr; and
the first V-III ratio is 5 to 10 and the second V-III ratio is 10,000 to 15,000.

16. The method of claim 15 wherein:
the first temperature is higher than the second temperature;
the first pressure is lower than the second pressure; and
the first V-III ratio is lower than the second V-III ratio.

17. The method of claim 15 wherein:
forming the first conductivity type III-V semiconductor core or core seed comprises forming the core using paused CVD comprising alternating growth and nitridation steps;
the first V-III ratio during the growth steps in paused CVD is lower than the second V-III ratio; and
a metal organic precursor flow is paused while a nitrogen containing precursor flow is increased during the nitridation steps.

18. The method of claim 15 wherein the nanopyramid is located over a dielectric growth mask containing an opening.

19. The method of claim 18 wherein the first conductivity type semiconductor core or core seed comprises the core which is epitaxially grown on a semiconductor buffer layer exposed in the opening such that the core protrudes from the opening.

20. The method of claim 15 further comprising forming an electrode over the second layer of the second conductivity type.

21. The method of claim 20 further comprising forming at least one feature which reduces or eliminates leakage current at tips of the nanopyramids.

22. The method of claim 21 wherein the at least one feature is selected from at least one of an insulating material tip mask, a hydrogen implanted semiconductor tip region having a higher resistivity than semiconductor sidewalls of the nanopyramids, a plasma damaged semiconductor tip region having a higher resistivity than semiconductor sidewalls of the nanopyramids, a flattened tip in truncated pyramid shaped nanopyramids, and the first conductivity type semiconductor shell having a truncated pyramid shape.

23. The method of claim 20 further comprising forming at least one feature which reduces or eliminates leakage current at bases of the nanopyramids.

24. A method of making a nanopyramid, comprising:
forming a first conductivity type III-V semiconductor core or core seed using CVD at a first temperature, first pressure and first III-V ratio;
forming a first conductivity type III-V semiconductor shell enclosing the core or the core seed of the first conductivity type semiconductor using CVD at a second temperature, second pressure and second III-V ratio;
forming a first layer of a second conductivity type semiconductor over the shell of the first conductivity type semiconductor to form the nanopyramid;
forming a second layer of the second conductivity type semiconductor over the first layer of the second conductivity type semiconductor;
forming an electrode over the second layer of the second conductivity type; and
forming at least one feature which reduces or eliminates leakage current at bases of the nanopyramids;
wherein at least one of the first temperature, first pressure and first V-III ratio is different from at least one of the second temperature, second pressure and second V-III ratio, and
wherein the at least one feature comprises a semiconductor foot portion of at least one of the first conductivity type semiconductor or the first layer of the second conductivity type semiconductor which extends under the electrode contacting the second layer of the second conductivity type semiconductor.

25. The method of claim 24 wherein the semiconductor foot portion comprises an AlGaN foot portion having greater than 5% aluminum and which is located on a dielectric growth mask containing a plurality of openings.

26. The method of claim 24 wherein the at least one feature comprises the semiconductor foot portion.

27. The method of claim 24 wherein the at least one feature comprises the first layer of the second conductivity type semiconductor which extends under the electrode contacting the second layer of the second conductivity type semiconductor.

28. The method of claim 1 wherein the at least one feature comprises the semiconductor foot portion.

29. The method of claim 1 wherein the at least one feature comprises the first layer of the second conductivity type semiconductor which extends under the electrode contacting the second layer of the second conductivity type semiconductor.

* * * * *